United States Patent [19]

Shimada

[11] Patent Number: 4,753,819

[45] Date of Patent: Jun. 28, 1988

[54] METHOD FOR APPLYING A MOISTUREPROOF INSULATOR COATING ON PACKAGED CIRCUIT BOARDS

[75] Inventor: Takaji Shimada, Kawaguchi, Japan

[73] Assignee: Nordson Corporation, Amherst, Ohio

[21] Appl. No.: 941,365

[22] Filed: Dec. 15, 1986

[30] Foreign Application Priority Data

Dec. 27, 1985 [JP] Japan ................................. 60-294768

[51] Int. Cl.$^4$ ............................................. B05D 5/12
[52] U.S. Cl. ..................................... 427/96; 427/420; 427/421; 427/207.1
[58] Field of Search ............... 427/96, 420, 421, 207.1

[56] References Cited

U.S. PATENT DOCUMENTS

| | | | |
|---|---|---|---|
| 3,526,535 | 9/1970 | Plumat | 427/420 |
| 3,852,095 | 12/1974 | Hogstrom | 117/43 |
| 4,300,184 | 11/1981 | Colla | 361/397 |
| 4,337,281 | 6/1982 | Boone | 427/236 |
| 4,424,252 | 1/1984 | Nativi | 428/209 |
| 4,490,496 | 12/1984 | Maekawa | 427/96 |
| 4,600,601 | 7/1986 | Tamura | 427/96 |

FOREIGN PATENT DOCUMENTS 2077625A 12/1981 United Kingdom ............ 427/207.1

Primary Examiner—Shrive P. Beck
Assistant Examiner—Vi Duong Dang
Attorney, Agent, or Firm—Wood, Herron & Evans

[57] ABSTRACT

A method of applying coating material to only selected areas of a packaged printed circuit board wherein the coating material is supplied to a flat-pattern nozzle at a pressure sufficient to produce a liquid film emission in a flat leaf-shaped pattern which portion of the nozzle emission is substantially free of atomized particles. The circuit board is positioned relative the nozzle to place the board in the path of the film pattern and relative movement between the nozzle and board is effected in conjunction with controlling the supply of coating to the nozzle to coat only desired regions of the board while avoiding deposit of coating material on areas to be left uncoated.

5 Claims, 8 Drawing Sheets

FIG.I

| mmφ | cc/min | 2.0 | 4.0 | 6.0 | 8.0 | 10.0 | 12.0 | 14.0 | W mm/mm |
|---|---|---|---|---|---|---|---|---|---|
| 0.12 | 8 | ▨ | | | | | | | 5.0 |
| 0.18 | 12 | ▨ | | | | | | | |
| 0.23 | 20 | | ▨ | | | | | | 12.0 |
| 0.28 | 29 | | ▨ | | | | | | |
| 0.33 | 51 | | | ▨ | | | | | 16.0 |
| 0.41 | 70 | | | ▨ | | | | | |
| 0.50 | 110 | | | | ▨ | ▨ | | | 20.0 |
| 0.61 | 167 | | | | ▨ | ▨ | | | |
| 0.73 | 242 | | | | ▨ | ▨ | | | |
| 0.89 | 321 | | | | | | ▨ | ▨ | 27.0 |
| 1.12 | 432 | | | | | | ▨ | ▨ | |
| 1.22 | 590 | | | | | ▨ | ▨ | | |
| 1.35 | 631 | | | | | ▨ | ▨ | | |

FIG.15

METHOD FOR APPLYING A MOISTUREPROOF INSULATOR COATING ON PACKAGED CIRCUIT BOARDS

DETAILED DESCRIPTION OF THE INVENTION

Industrial Areas of Application

The invention pertains to a method for applying a moistureproof insulator coating on packaged circuit boards.

Conventional Techniques

Most recent packaged circuit boards for electronic instruments are coated by a moistureproof insulator film. Its purpose is, of course, to protect the circuit board from moisture, electric leakage, and dust. Natural varnishes were originally used in many cases as moistureproof insulators. However, recent types used in electronics are called humiseal coatings and some are used strictly for the circuit boards for electronic products. These insulator materials are all acryric, polyurethane, or epoxy synthetic resins and are dissolved in a volatile solvent. When they are applied on cleaned packaged circuit boards, a uniform resin film without pinholes is formed as the solvent evaporates continuously. The following five methods are generally used to apply coatings of these moistureproof insulators. The characteristic features and drawbacks of these methods are also described in the following.

(1) IMMERSION METHOD

Packaged circuit boards are immersed in an immersion tank consisting a moistureproof insulator.

Advantages

1. A good coating film can be formed over all surfaces of packaged circuit boards of complex shape.
2. Operation is simple.
3. Automation is possible; the method is suitable for mass production.

Drawbacks

1. Rigid control of the viscosity in the immersion tank is required.
2. Variation in the coating thickness occurs depending on the shape of the electronic components.
3. Electronic components can be damaged by the solvents.
4. Masking is required for areas not to be coated.
5. Dripping after coating must be prevented.
6. Workplace environment protection measures are required for the organic solvents.

(2) BRUSH-COATING METHOD

A moistureproof insulator is applied by a brush.

Advantages

1. All places can be coated.
2. No masking is required.

Drawbacks

1. Large differences in coating thickness.
2. Low production efficiency and large labor cost.
3. Automation impossible and unsuitable for mass production.
4. Workplace environment protection methods are required for the organic solvents.

(3) ROLLER METHOD

Sheepswool rolls are impregnated with a moistureproof insulator and a coating is applied on the materials to be coated by manual or automatic rotation of said rolls.

Advantages

1. High-speed coating is possible.
2. Automation is possible and the method is suitable for mass production.

Drawbacks

1. Unsuitable for nonflat sections (suitable for a flat reverse side)
2. Masking is required.

(4) SPRAYING METHOD

A moistureproof insulator is applied by spraying.

Advantages

1. Simple
2. Thin uniform film can be obtained.
3. Automation is possible and the method is suitable for mass production.

Drawbacks

1. Poor yield for entire surface coating, thus the method is uneconomical.
2. Parts behind some components may be left uncoated.
3. Masking is required.
4. Workplace environment-protection measures are required for the organic solvents.

(5) SLIT DIE METHOD

A moistureproof insulator is pressurized and extruded from a slit die to eject a film for coating (if required, air pressure is applied from above the film).

Advantages

1. Relatively wide films can be coated.
2. Automation is possible and the method is suitable for mass production.

Drawbacks

1. Variations occur in the thickness of the coating on components and the film may break.
2. Necking occurs at both edges of the film, and thus the coating on said parts is thick.
3. Masking is not required.

The outline of each method is as described above. All of them have some good and bad points. All methods except brush coating require masking for those parts to be left uncoated. The masking operations, i.e., mounting and removal of the masks, must be done manually, thus causing a bottleneck in the mass production process. The parts to be masked on a packaged circuit board are the connectors components that may be replaced, emission diodes, volume controls, and mounting holes.

PROBLEMS TO BE SOLVED BY THE INVENTION

As described above, one big problem with the convention techniques for applying a coating agent on packaged circuit boards is that masking is required. The most widely used among the above-mentioned examples is the spraying method.

The present invention applies the "Film Coating Method by Nozzles" applied for by patent application on November 29, 1985, by the applicant, to spraying processes. The above-mentioned method is summarized in the following, based on the specification of the said patent application.

Spraying methods can be classified into two: air spraying and airless spraying. In the former, almost no liquid droplets can be seen in the spray pattern ejected from the nozzle. In airless spraying, however, especially in flat spraying, a small quantity of liquid can be seen in the form of a film near the nozzle opening. This phenomenon is called "dovetailing" or "tailing" in abbreviated form. Because this liquid film can be utilized simply to apply a film coating in some cases, this airless spraying method is adopted in the present operation. To begin with, airless spraying converts the coating liquid to fine particles, i.e., it atomized the liquid without using air. The liquid itself is pressurized, then atomized into the atmosphere by the ejection force of the pressurized liquid at the nozzle exit and delivered to the surface to be coated. In airless spraying, especially in a flat spray pattern, atomization does not occur over a certain distance "l" from the opening of nozzle Nf, as shown in FIGS. 6A and 6B, i.e., the liquid remains as is in the form of a dovetail-shaped film (F). The length l (distance from the nozzle opening) of the film F depends on the type of liquid and the pressure applied to the liquid, but is reported to be about 5 to 8 mm in the case of general-type paints.

At the start, the spraying of a paint utilizes the atomized part of the paint to apply a coating in both air spraying and airless spraying. This atomized part is an area where an infinite number of fine particles of paint are suspended in the atmosphere. Because these fine particles are floating almost uniformly (at equal density), the spraying method is characterized in that it can achieve a relatively uniform coating of the materials to be coated. On the other hand, there is a drawback in that the density gradually decreases in the zone surrounding a mass of these fine particles (i.e., the atomized part) in a diffuse manner. In other words, there is no distinct boundary to the mist. Therefore, those parts to be left uncoated on a material to be coated must be masked. However, masking becomes unnecessary if there is not atomized zone in the spray pattern.

Accordingly, the applicant usually carried out coating with a distinct boundary, i.e., coating that does not require masking, by utilizing the dovetail section near the nozzle above the said flat spray pattern, i.e., the liquid film zone where no fine particles are present, in airless spraying operations.

To obtain the aforementioned flat spray pattern, however, a flat-pattern nozzle for airless spraying must be used. A flat-pattern nozzle Nf is illustrated in FIG. 7. The figure is a three-dimensional illustration viewed from below at an oblique angle. The dome-shaped end of the nozzle is cut to provide a V-shaped slit hole. A cross-cut nozzle (a patent by the applicant's parent company, the Nordson Corporation, U.S.A.) for airless spraying can also produce flat spray patterns. In short, any type of nozzle for airless spraying can produce a dovetail-shaped liquid film near the nozzle opening.

Coating with said liquid film in contact with the material to be coated causes almost no scattering of the fine particles in the coated pattern, but instead produces a comparatively clear strip-like coating by moving the spray nozzle, or the material to be coated, relative to the nozzle. This method has also been patented by the applicant's parent company, the Nordson Corporation (U.S.A.).

However, there have been some difficulties in actually using the method. Namely, (1) some splashing occurs, (2) the coating thickness varies, (3) the width of the strip-like coating is relatively narrow, (4) the distance between the nozzle and the material to be coated is relatively short, thus the coating of packaged circuit boards, especially those with nonflat surfaces, is extremely difficult.

The object of the present invention is to solve the above-mentioned problems.

WAYS TO SOLVE THE PROBLEMS

In the flat spray pattern in airless spraying of a liquid, a dovetail-shaped liquid film is formed over a certain distance from the nozzle opening, as described above. In order to utilize this film zone for coating, it is necessary to make the said film zone wider and more stable.

Normally, a liquid pressure in the range of 40 to 80 kg/cm$^2$ is used in the airless spraying of paints, even though this pressure differs with the viscosity and other conditions. On the other hand, it is well known that in this range, the length of the said film zone is inversely proportional to the above-mentioned liquid pressure for similar paints. However, nobody was interested in lowering the pressure beyond the said limit for the reason that low liquid pressure causes low atomization.

The inventor examined the dovetail-shaped liquid film above the flat spray pattern in detail, lowering the liquid pressure to less than 40 kg/cm$^2$, which was not usually done. First, two types of liquids with different viscosities, i.e., paints with viscosities of 100 cps and 50 cps, were chosen. The variations in the airless spray pattern with liquid pressure when the pressure was gradually lowered from the normally used pressure are shown in FIGS. 8–11. In FIG. 8, the length "$l_1$" of dovetail-shaped liquid film $F_1$ of the paint with a viscosity of 100 cps at 50 kg/cm$^2$ is about 5 mm, and the same length can be attained at a liquid pressure of 35 kg/cm$^2$ with the paint of viscosity 50 cps, as shown in parenthesis. FIG. 9 shows the pattern at 20 kg/cm$^2$ for 100 cps viscosity, where the width of the flat spray pattern $F_2$ is considerably narrower than the width in FIG. 8, but the length "$l_2$" is longer, being about 8 mm. FIG. 10 shows that the lower section of flat spray pattern $F_3$ is changed to a drooping shape from the dovetail shape and the length "$l_3$" is increased to about 9 mm as the liquid pressure lowered to 10 kg/cm$^2$. However, the formation of liquid droplets can be seen below the liquid film. Furthermore, FIG. 11 shows that the length "$l_4$" of dovetail-shaped film $F_4$ is increased to about 12 mm at a liquid pressure of 5 kg/cm$^2$ and the dovetail is made narrower, resembling the shape of a gourd, still with the formation of liquid droplets below the film even though their amount is not great. To express the above-mentioned numerical values by graphs, we obtain FIG. 12. That is, the curves approach the origin asymptotically from around 5 kg/cm$^2$ for both viscosities, i.e., 50 and 100 cps. In other words, the length of the dovetail liquid film sharply increases. That is, it was found that a large liquid film can be obtained at a liquid pressure of 5 kg/cm$^2$. In this case, however, splashing occurs when the liquid film $F_4$ is brought into contact with the surface to be coated. This can be attributed to the ejection speed at 5 kg/cm². Therefore, the liquid pressure was further lowered at 2 kg/cm², then the dovetail shape changed to a leaf shape and no liquid droplets were formed below the film; it became clear that no splashing occurs even when the leaf-shaped film zone is brought into contact with the surface to be coated.

The ejected pattern at said liquid pressure of 2 kg/cm² is composed of a leaf-shaped liquid film Fs, as shown in FIG. 13A. Viewed from the side, the spray forms a narrow collimated stream as shown in FIG. 13B, and the lower section of said leaf shape becomes narrower and forms a thread.

The maximum width of leaf-shaped film Fs is most suitable for film coating and can produce a stable film thickness. If the maximum width is denoted by W and the distance from the nozzle opening to said section by L, we obtain L=24 mm, W≈10 mm, and thickness≈1 mm for a viscosity of 100 cps, a liquid pressure of 2 kg/cm², and an ejection rate of 400 cc/min.

Experimental data for the above-mentioned method are as follows.

EXPERIMENT NO. 1

Maximum width W of leaf-shaped liquid film CF and distance L between the nozzle opening and said section were measured for different nozzle sizes at a liquid viscosity of 100 cps and a liquid pressure of 2 kg/cm². The results are summarized in FIG. 14. The nozzle size is given by the diameter of a circular nozzle corresponding to the area of the slit opening of the flat spray pattern nozzle.

EXPERIMENT NO. 2

W and L are shown in FIG. 15 for a liquid viscosity of 50 cps with the other conditions the same as in Experiment No. 1.

As described above, the length of the liquid film zone from the nozzle was increased to about 25 mm and its width was increased to more than 10 mm as shown in the above-mentioned graphs by lowering the liquid pressure to less than 4 kg/cm², whereas the length of a film for conventional airless spraying was only about 5 mm. No scattering of particles occurs and a strip-like pattern coating with a clear border can be achieved. Another benefit is that uniform coating films can be obtained because the variations in coating thickness is lessened, which in other cases was large. The above summarizes the "Film Coating Method by Nozzles", a patent application by the applicant.

The present invention applies the above-mentioned method for coating a moistureproof insulator on packaged circuit boards. First, the moistureproof insulator is ejected from a nozzle and a leaf-shaped film is coated on the packaged circuit board. In this way, a strip-like coating film S as shown in FIG. 16 can be obtained (FIG. 16). It is desired that the width of the strip-like band be as great as possible. Therefore, coating should be carried out so as to contact the maximum width of said leaf shape with the areas to be coated on the packaged circuit board. The thickness of the coating film is of course determined by the relative velocity of the nozzle and the material to be coated, but a thickness between 20 and 60 microns is desirable.

After coating a strip with a certain width in this way, a wider area is covered by lapping strips $S_1, S_2, S_3, \ldots$ in parallel by the required width as shown in FIG. 1, or moving nozzle Nf and circuit boards $B_1, B_2$ relative to each other in a zigzag fashion (Z) as shown in FIG. 2. When parts to be left uncoated $U_1, U_2, U_3, \ldots$ are encountered during the strip coating operation, i.e., on the strip coating course, the spray ejector is closed as shown in FIG. 3 so as to shut off the film, thus the coating is not applied, and when the zone to be coated is reached again with further progress of the operation, the said ejector is again opened to eject a film from the nozzle so that the strip coatings $S_{11}, S_{12}, S_{13}, \ldots$ are applied. This intermittent coating can be easily achieved automatically by robots as well as manually.

Because the base of a component on a packaged circuit board is often left uncoated if sprayed from directly above, it is better to spray from above at an oblique angle as shown in FIG. 4.

The above description is given assuming that one nozzle is used, but a planar coating can be applied at once over the entire board by arranging multi-component nozzles in series as shown in FIG. 5 and moving them in a direction perpendicularly to the nozzles. For parts to be left uncoated, the ejectors corresponding to these parts should be operated.

REALIZATION OF THE INVENTION

As described above, the method of the invention can coat packaged circuit boards efficiently with a moistureproof insulator by low-pressure airless spraying of the insulator onto the packaged circuit board whereby a liquid film is ejected in the form of a leaf and the resultant strip-like coating bands are lapped to form a planar coating, without employing masks over the parts to be left uncoated by shutting off the ejection to stop the coating during the coating operation and also by not generating a mist during spraying.

BRIEF DESCRIPTION OF THE FIGURES

FIG. 15 is a size graph of W and L at 1 kg/cm$^2$ for said liquid for different nozzles sizes.

Figure 1:
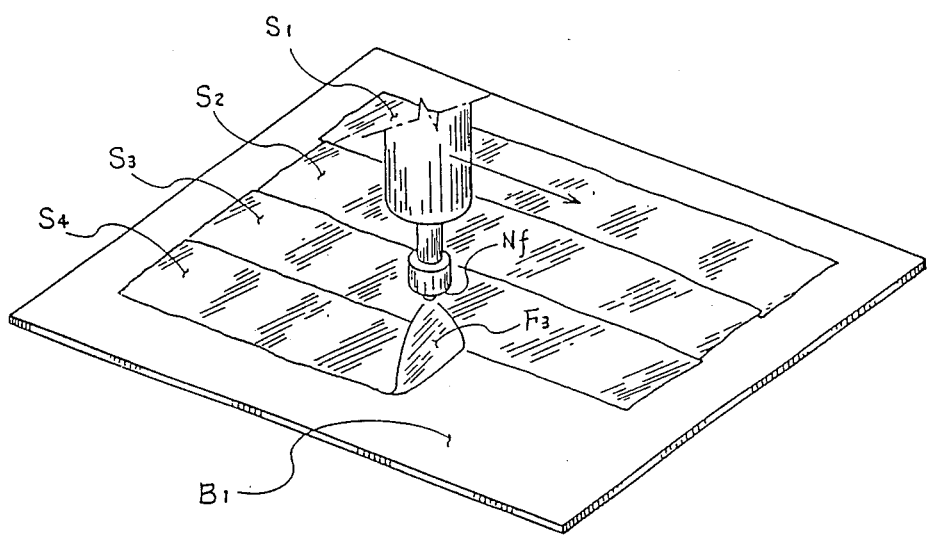
FIG. 1 illustrates the operation of applying the coating bands in parallel by a single flat spray pattern nozzle according to the invention.
Figure 2:
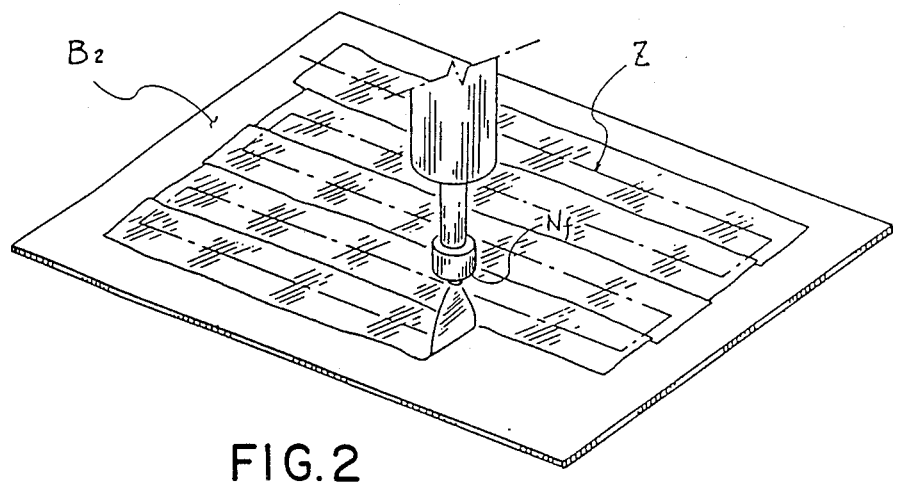
FIG. 2 illustrates the operation of coating in a zigzag fashion by the above-mentioned nozzle.
Figure 3:
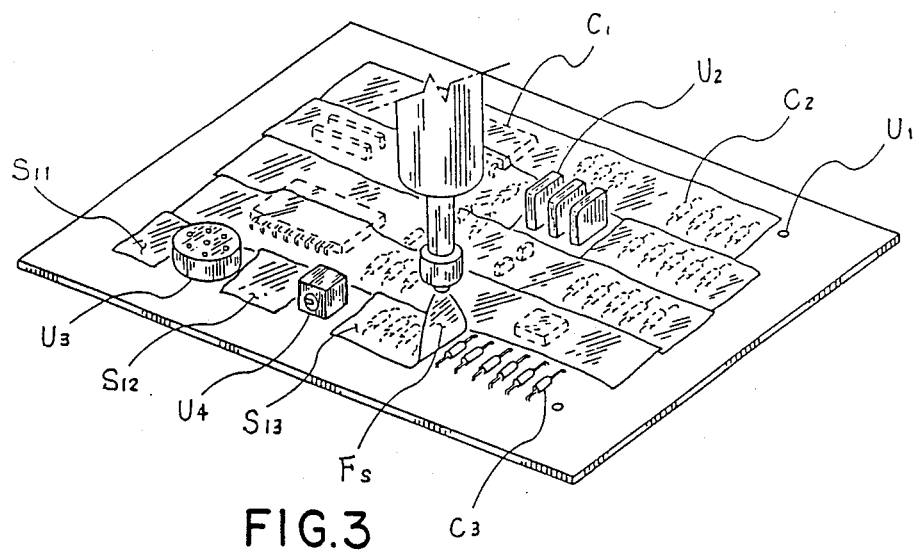
FIG. 3 illustrates the operation of coating by said nozzle over parts to be coated and parts to be left uncoated on a packaged circuit board.
Figure 4:
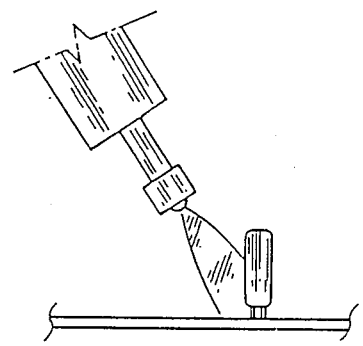
FIG. 4 illustrates the operation of coating the base of an electronic component from above at an oblique angle.
Figure 5:
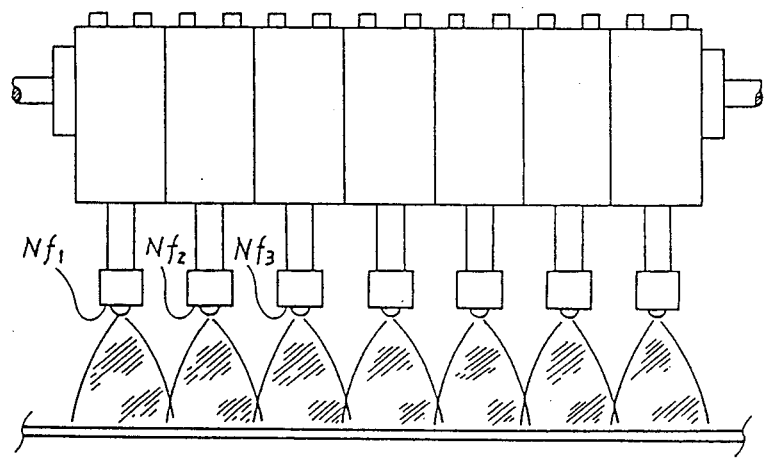
FIG. 5 illustrates the operation of coating with the use of multi-component flat pattern nozzles in series.
Figure 6A:
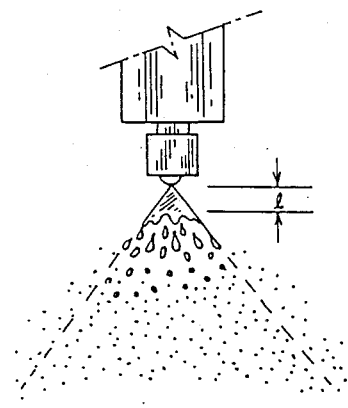
FIG. 6A is the front view of a spray pattern from a flat spray pattern nozzle.
Figure 6B:
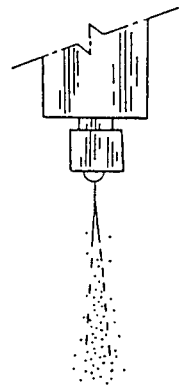
FIG. 6B is the side is the side view of the above-mentioned pattern.
Figure 6C:
FIG. 6C is a planar view of the coating pattern in the above-mentioned figures.
Figure 7:
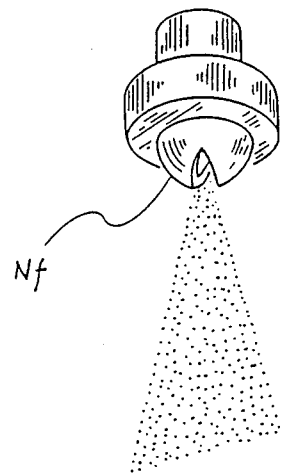
FIG. 7 is a three-dimensional view of the flat spray pattern nozzle viewed from below at an oblique angle.
Figure 8:
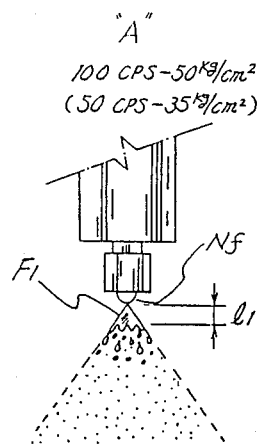
FIG. 8 is the front view of a spray pattern from the flat spray pattern nozzle for a liquid with a viscosity of 100 cps at 50 kg/cm² (case "A").
Figure 9:
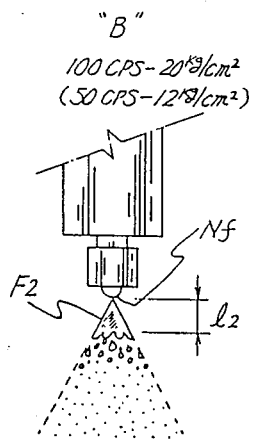
FIG. 9 indicates the spray pattern of said liquid at 20 kg/cm² (case "B").
Figure 10:
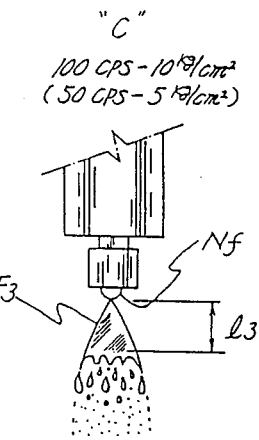
FIG. 10 indicates the spray pattern of said liquid at 10 kg/cm² (case "C").
Figure 11:
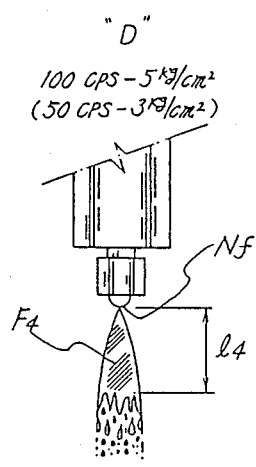
FIG. 11 indicates the spray pattern of said liquid at 5 kg/cm² (case "D").
Figure 12:
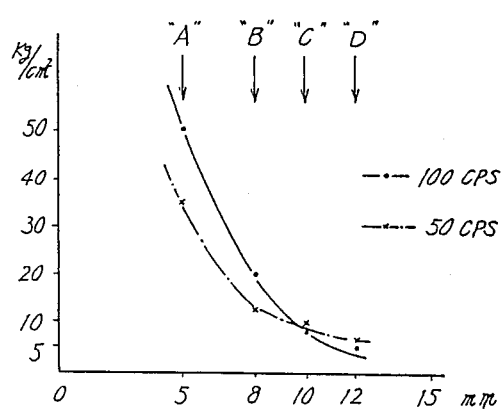
FIG. 12 is a graph indicating the length of the film from the nozzle opening in each said case.
Figures 13A, 13B, 14:
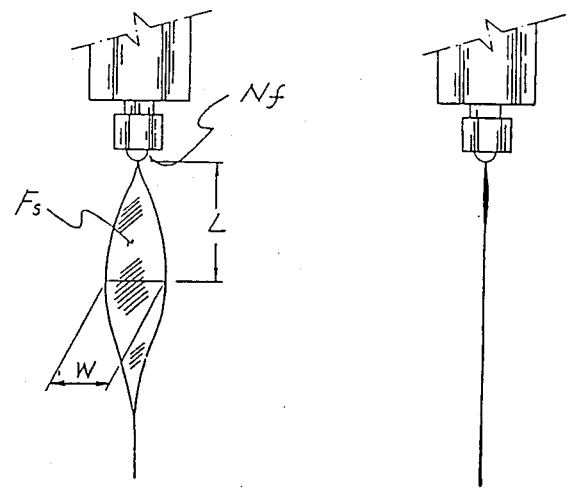
FIG. 13A is the front view of a leaf-shaped film at 2 kg/cm² for said liquid.
FIG. 13B is the side view of FIG. 13A.
FIG. 14 is a graph indicating the maximum width W and maximum length L of the leaf-shaped film at 2 kg/cm$^2$ for said liquid for different nozzle sizes.
Figure 16:
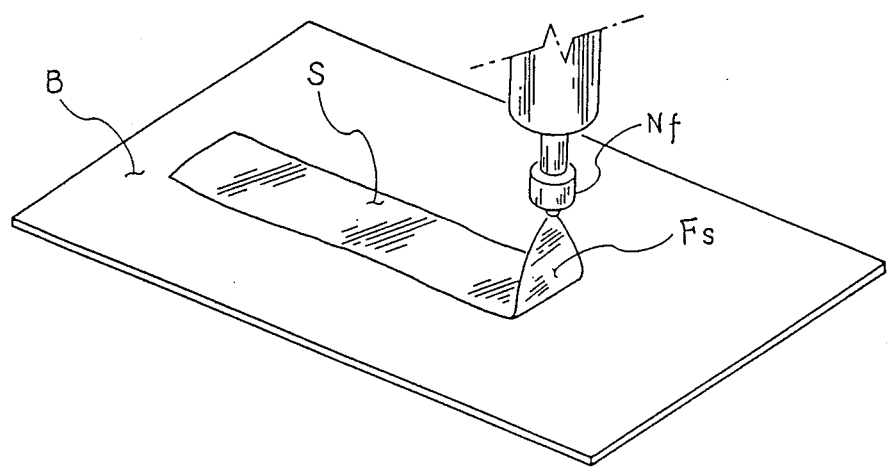
FIG. 16 illustrates the operation of coating a liquid in the form of a strip by said nozzle.

DESCRIPTION OF THE MAIN SYMBOLS $C_1, C_2, C_3, \ldots$ parts to be coated; $F \ldots$ dovetail-shaped film; $Fs \ldots$ leaf-shaped film; $Nf \ldots$ flat spray pattern nozzle; $L \ldots$ length of a leafshaped film between the nozzle opening and the maximum width of the film; $S, S_1, S_2, \ldots$ strip-like coating bands; $U_1, U_2, U_3, \ldots$ parts to be left uncoated; and $W \ldots$ maximum width of a leaf-shaped film.

I claim:

1. A mask-free method of applying a moistureproof insulative coating to selected areas of a circuit board without applying insulative coating to regions to be left uncoated, comprising the steps of:

supplying insulative liquid coating material to a flat-pattern nozzle means at a supply pressure to produce a liquid film emission from the nozzle means in a flat pattern having a leaf shape which has a maximum width W at its approximate center and which decreases in width on both sides of said center to an approximately zero width at a distance L on each side of said center, said leaf shaped film being substantially free of atomized particles of coating.

positioning the nozzle means and circuit board at a specified distance apart relative to each other to position the circuit board in the path of the flat leaf shape liquid film pattern, producing relative movement between the nozzle means and circuit board in a direction generally transverse to the plane of the flat pattern, and controlling the liquid coating supply during relative movement between the nozzle means and circuit board to (a) supply liquid to the nozzle means when the flat pattern is directed toward the selected areas to be coated to impinge a flat liquid film thereon and thereby coat the areas to be coated, and (b) interrupt the supply of liquid to the nozzle means when the flat pattern is directed toward the regions to be left uncoated to terminate emission of the flat liquid film and prevent deposit thereof on the regions to be left uncoated.

2. The method of claim 1 wherein the relative movement step includes successively producing relative movement between the nozzle means and adjacent overlapping sections of the circuit board to successively produce lapped coatings on selected areas of adjacent overlapping circuit board sections.

3. The method of claim 1 wherein the nozzle means includes plural individual nozzles spaced relative to each other and to the circuit board to produce lapped coatings on the circuit board when coating is supplied to the nozzles and the circuit board moves transversely to the respective flat patterns emitted by the nozzles.

4. The method of claim 1 wherein the liquid coating supply step includes supplying the liquid coating material to the nozzle means at a pressure in the approximate range of 0.3–4 Kg/cm$^2$.

5. The method of claim 1 wherein the circuit board is located at the approximate center of said leaf shape liquid film pattern whereat the width of said pattern is at said maximum.

* * * * *